United States Patent
Chae et al.

(10) Patent No.: US 12,557,308 B2
(45) Date of Patent: Feb. 17, 2026

(54) SEMICONDUCTOR DEVICE

(71) Applicant: Samsung Electronics Co., Ltd., Suwon-si (KR)

(72) Inventors: Hongsik Chae, Suwon-si (KR); Taekyun Kim, Suwon-si (KR); Jinsu Lee, Hwaseong-si (KR); Yirang Lim, Suwon-si (KR); Hanjin Lim, Seoul (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 513 days.

(21) Appl. No.: 17/993,943

(22) Filed: Nov. 24, 2022

(65) Prior Publication Data
US 2023/0253445 A1   Aug. 10, 2023

(30) Foreign Application Priority Data
Feb. 9, 2022   (KR) .................. 10-2022-0016677

(51) Int. Cl.
*H10D 1/68* (2025.01)
*H10B 12/00* (2023.01)
*H10D 1/00* (2025.01)

(52) U.S. Cl.
CPC ........... *H10D 1/696* (2025.01); *H10B 12/033* (2023.02); *H10B 12/315* (2023.02); *H10B 12/34* (2023.02); *H10D 1/042* (2025.01); *H10D 1/043* (2025.01); *H10D 1/716* (2025.01); *H10B 12/0335* (2023.02)

(58) Field of Classification Search
CPC ...... H10B 12/033; H10D 1/043; H10D 1/716; H10D 1/696
See application file for complete search history.

(56) References Cited

U.S. PATENT DOCUMENTS

| | | | |
|---|---|---|---|
| 6,559,025 B2 | 5/2003 | Kim | |
| 8,183,614 B2 | 5/2012 | Nieh | |
| 8,441,100 B2 | 5/2013 | Lee et al. | |
| 9,111,953 B2 | 8/2015 | Park et al. | |
| 9,362,422 B2 | 6/2016 | Lim | |

(Continued)

FOREIGN PATENT DOCUMENTS

| | | |
|---|---|---|
| CN | 114068812 A | 2/2022 |
| KR | 1020040107842 A | 12/2004 |

(Continued)

*Primary Examiner* — Jose R Diaz
(74) *Attorney, Agent, or Firm* — Muir Patent Law, PLLC

(57) ABSTRACT

A semiconductor device includes: a substrate; a contact plug on the substrate; a lower electrode electrically connected to the contact plug, and including a first electrode layer, a first buffer layer, and a second electrode layer, sequentially stacked; a first support layer in contact with an upper surface of the lower electrode and disposed to overlap at least a portion of the lower electrode, the first support layer extending in a direction parallel to an upper surface of the substrate; a dielectric layer disposed on the lower electrode and the first support layer; and an upper electrode disposed on the dielectric layer. The lower electrode comprises a first region overlapping the first support layer, and having a first height; and a second region not overlapping the first support layer, and having a second height lower than the first height.

20 Claims, 15 Drawing Sheets

(56) References Cited

U.S. PATENT DOCUMENTS

| | | | |
|---|---|---|---|
| 10,734,389 B2 | 8/2020 | Lee et al. | |
| 10,971,496 B2 | 4/2021 | Kim et al. | |
| 11,152,368 B2 | 10/2021 | Choi et al. | |
| 2018/0019300 A1* | 1/2018 | Lee | H10D 1/716 |
| 2022/0037461 A1 | 2/2022 | Cho et al. | |

FOREIGN PATENT DOCUMENTS

| | | |
|---|---|---|
| KR | 1020090070910 A | 7/2009 |
| KR | 1020090111018 A | 10/2009 |
| KR | 1020110055246 A | 5/2011 |
| KR | 101044006 B1 | 6/2011 |

\* cited by examiner

SEMICONDUCTOR DEVICE

CROSS-REFERENCE TO RELATED APPLICATION(S)

This application claims priority under 35 U.S.C. § 119 to Korean Patent Application No. 10-2022-0016677, filed on Feb. 9, 2022, in the Korean Intellectual Property Office, the disclosure of which is incorporated in its entirety herein by reference.

BACKGROUND

1. Field

The present inventive concept relates to a semiconductor device.

2. Description of Related Art

In accordance with the demand for high integration and miniaturization of a semiconductor device, a size of a capacitor of the semiconductor device may also be miniaturized. Accordingly, various studies have been undertaken to optimize a structure of a capacitor capable of storing information in a dynamic random-access memory (DRAM).

SUMMARY

An aspect of the present inventive concept is to provide a semiconductor device having improved electrical characteristics and reliability.

According to aspects of the present inventive concept, a semiconductor device, may include: a substrate; a contact plug on the substrate; a lower electrode electrically connected to the contact plug, and including a first electrode layer, a first buffer layer, and a second electrode layer, sequentially stacked; a first support layer in contact with an upper surface of the lower electrode and disposed to overlap at least a portion of the lower electrode, and extending in a direction parallel to an upper face of the substrate; a dielectric layer disposed on the lower electrode and the first support layer; and an upper electrode disposed on the dielectric layer. The lower electrode comprises a first region overlapping the first support layer, and having a first height; and a second region not overlapping the first support layer, and having a second height lower than the first height.

According to aspects of the present inventive concept, a semiconductor device may include: a substrate; lower electrodes disposed on the substrate; a support layer in contact with the lower electrodes, and connecting the adjacent lower electrodes, the support layer having an opening; a dielectric layer disposed on the lower electrode and the support layer; and an upper electrode disposed on the dielectric layer, wherein the lower electrodes may include: a first electrode layer disposed on the substrate, and including a first material, a first buffer layer disposed on the first electrode layer, and including a second material, and a second electrode layer disposed on the first buffer layer, and including a third material. At least one of the lower electrodes may include a first region vertically overlapping the support layer and in contact with the support layer, and a second region vertically overlapping the opening. The opening may be disposed between the adjacent support layers. The second material is different from each of the first and third materials.

According to aspects of the present inventive concept, a semiconductor device, may include: a lower electrode including a first region and a second region; a dielectric layer disposed on the lower electrode; and an upper electrode disposed on the dielectric layer. The lower electrode may include a plurality of electrode layers and at least one buffer layer interposed between the plurality of electrode layers and including at least one metal oxide. The first region has a first height and the second region has a second height lower than the first height.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred embodiments of the present inventive concept will be described with reference to the accompanying drawings.

A semiconductor device according to example embodiments will be described with reference to FIGS. 1 and 2.

Figure 1:
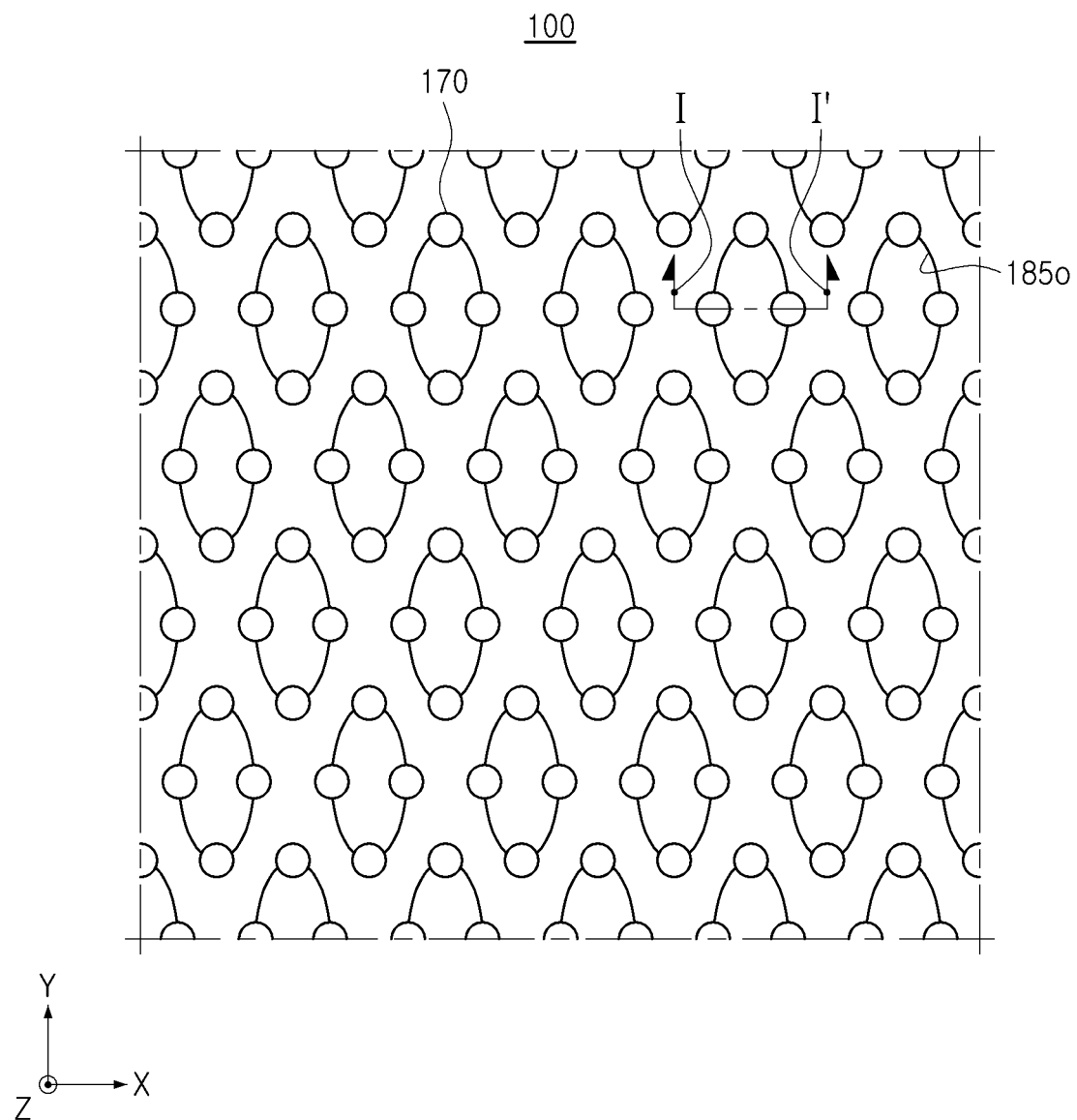
FIG. 1 is a schematic layout diagram of a semiconductor device according to example embodiments.

FIG. 1 is a schematic layout diagram of a semiconductor device according to example embodiments. FIG. 2 is a schematic cross-sectional view of a semiconductor device according to example embodiments. FIG. 2 illustrates a cross-section taken along line I-I' of FIG. 1.

Figure 2:
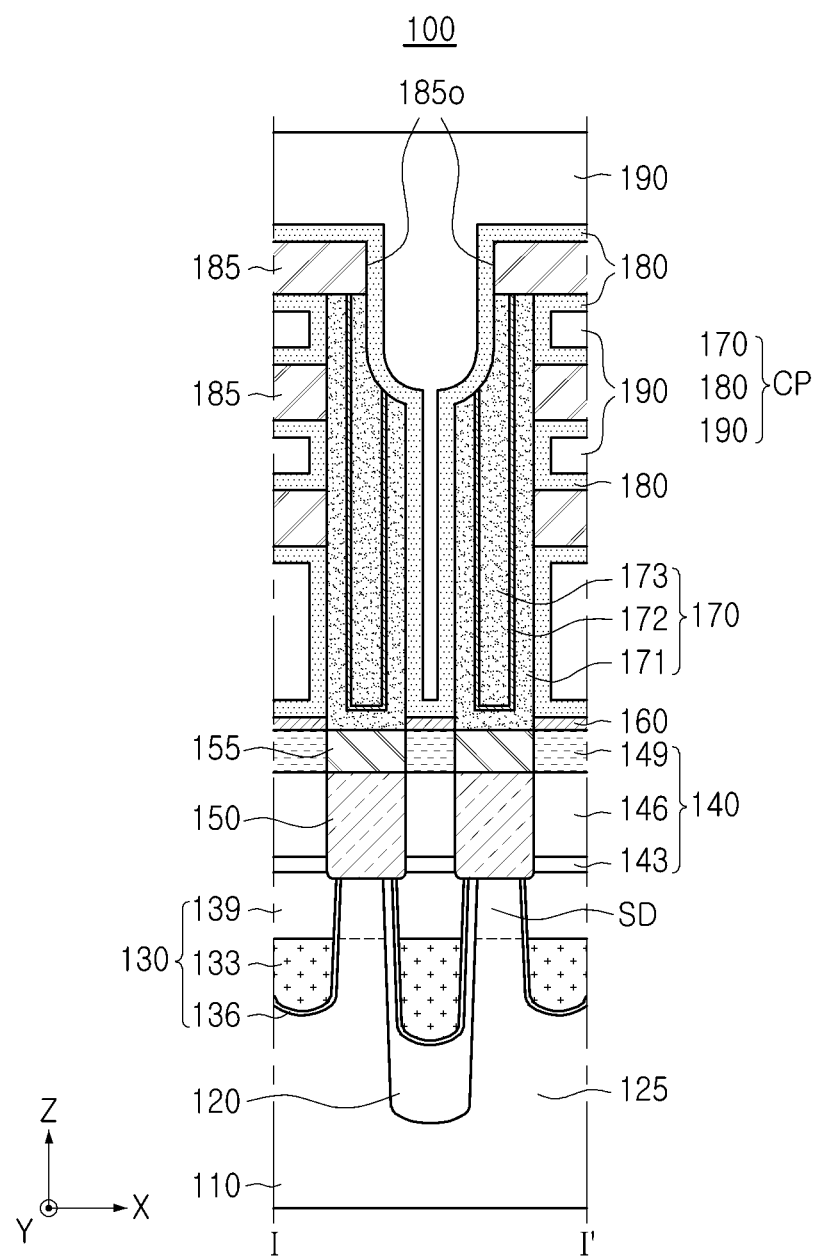
FIG. 2 is a schematic cross-sectional view of a semiconductor device according to example embodiments.

Referring to FIGS. 1 and 2, a semiconductor device 100 may include a substrate 110, a lower electrode 170 disposed on the substrate 110, a dielectric layer 180 disposed on the lower electrode 170, and an upper electrode 190 disposed on the dielectric layer 180. The lower electrode 170, the dielectric layer 180, and the upper electrode 190 may constitute a capacitor CP. The semiconductor device 100 may further include a contact plug 150 and a landing pad 155 connecting the substrate 110 and the capacitor CP.

The substrate 110 may include or be formed of a semiconductor material, for example, a group IV semiconductor, a group III-V compound semiconductor, or a group II-VI compound semiconductor. For example, the group IV semiconductor may include silicon, germanium, or silicon-germanium. The substrate 110 may further include impurities. The substrate 110 may be a substrate including a silicon substrate, a silicon-on insulator (SOI) substrate, a germanium substrate, a germanium-on insulator (GOI) substrate, a silicon-germanium substrate, or an epitaxial layer.

The substrate 110 may include a device isolation region 120 and active regions 125 defined by the device isolation region 120.

The active regions 125 may have a bar shape, and may be disposed in an island shape extending in one direction in the substrate 110. For example, the active regions 125 may be disposed to be inclined at a constant angle with respect to X and Y directions, and may be repeatedly arranged at the same interval. Due to the inclined arrangement of the active regions 125, cell density per unit area of the substrate 110 may be increased while securing a separation distance between the neighboring active regions 125.

The active regions 125 may have impurity regions SD having a predetermined depth from the upper surface of the substrate 110. The impurity regions SD may be spaced apart from each other. The impurity regions SD may be provided as a source/drain region of a transistor formed by a word line WL (gate electrode layer 133). In example embodiments, depths of the impurity regions SD in the source region and the drain region may be different from each other.

The device isolation region 120 may be formed by a shallow trench isolation (STI) process. The device isolation region 120 may surround the active regions 125 and may electrically isolate the same from each other. The device isolation region 120 may be made of an insulating material, and for example, silicon oxide, silicon nitride, or a combination thereof. The device isolation region 120 may include a plurality of regions having different lower depths according to a width of a trench in which the substrate 110 is etched.

The substrate 110 may further include a buried gate structure 130 buried in the substrate 110 and extending in a first direction (Y direction).

The buried gate structure 130 may include a gate electrode layer 133, a gate dielectric layer 136, and a gate capping layer 139. The gate electrode layer 133 may be provided in a line shape extending in a first direction (Y direction) to constitute a word line. The word line may be disposed to cross the active region 125 and extend in the first direction (Y direction). For example, a pair of adjacent word lines may be disposed to cross one active region 125.

An upper surface of the gate electrode layer 133 may be positioned on a level lower than an upper surface of the substrate 110. In the present specification, height and depth of a term "level" may be defined based on a substantially flat upper surface of the substrate 110. The gate electrode layer 133 may constitute a gate of a buried channel array transistor (BCAT), but an example embodiment thereof is not limited thereto. In example embodiments, the gate electrode layer 133 may have a shape disposed above the substrate 110.

The gate electrode layer 133 may include a conductive material. The gate electrode layer 133 may include, for example, at least one of polycrystalline silicon (Si), titanium (Ti), titanium nitride (TiN), tantalum (Ta), tantalum nitride (TaN), tungsten (W), tungsten nitride (WN), and aluminum (Al). In some example embodiments, the gate electrode layer 133 may have a double-layer structure formed of different materials.

The gate dielectric film 136 may conformally cover a side surface and a bottom surface of the gate electrode layer 133. The gate dielectric film 136 may include at least one of silicon oxide, silicon nitride, and silicon oxynitride.

The gate capping layer 139 may be disposed above the gate electrode layer 133. The gate capping layer 139 may include an insulating material, for example, a silicon nitride.

The semiconductor device 100 may further include an interlayer insulating layer 140 disposed on the substrate 110.

The interlayer insulating layer 140 may be formed in plural. The interlayer insulating layer 140 may include, for example, first to third interlayer insulating layers 143, 146, and 149. Each of the first to third interlayer insulating layers 143, 146, and 149 may include an insulating material. For example, each of the first to third interlayer insulating layers 143, 146, and 149 may include at least one of silicon oxide, silicon nitride, and silicon oxynitride.

A contact plug 150 may be disposed on the substrate 110. The contact plug 150 may be formed through at least a portion of the interlayer insulating layer 140. In an example embodiment, the contact plug 150 may be disposed through the first and second interlayer insulating layers 143 and 146.

The contact plug 150 may be connected to one region of the active region 125. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The contact plug 150 may be disposed between word lines (gate electrode layers 133). A lower surface of the contact plug 150 may be positioned on a level the same as the upper surface of the substrate 110. The contact plug 150 may include a conductive material. The contact plug 150 may include for example, at least one of polycrystalline silicon (Si), aluminum (Al), copper (Cu), titanium (Ti), tantalum (Ta), ruthenium (Ru), tungsten (W), or molybdenum (Mo), platinum (Pt), nickel (Ni), and cobalt (Co), or a nitride thereof, but is not limited thereto.

The semiconductor device 100 may further include a landing pad 155 disposed between the contact plug 150 and the capacitor CP. The landing pad 155 may electrically connect the contact plug 150 and a lower electrode 170 of the capacitor CP. The landing pad 155 may be disposed on the contact plug 150 to penetrate at least a portion of the interlayer insulating layer 140. In an example embodiment, the landing pad 155 may be disposed through the third interlayer insulating layer 149. The landing pad 155 may include a conductive material, for example, at least one of polycrystalline silicon (Si), aluminum (Al), copper (Cu), titanium (Ti), tantalum (Ta), ruthenium (Ru), tungsten (W), molybdenum (Mo), platinum (Pt), nickel (Ni), and cobalt (Co), or a nitride thereof, but is not limited thereto.

The semiconductor device 100 may further include an etch stop layer 160 disposed on the interlayer insulating layer 140. The lower electrode 170 of the capacitor CP may penetrate the etch stop layer 160, and be in contact with the landing pad 155. The etch stop layer 160 may include an insulating material having etch selectivity under a specific etch condition with mold layers (SL in FIG. 8A). In an example embodiment, when the mold layers (SL in FIG. 8A) include silicon oxide, the etch stop layer 160 may include at least one of silicon nitride (SiN), silicon boron nitride (SiBN), or silicon carbonitride (SiCN).

The capacitor CP may include a lower electrode 170, a dielectric layer 180, and an upper electrode 190. The semiconductor device 100 may further include a support layer 185 contacting the capacitor CP, extending in a direction parallel to the substrate 110, and connecting adjacent lower electrodes 170 to each other.

The lower electrode 170 may penetrate the etch stop layer 160. A lower surface of the lower electrode 170 may contact the landing pad 155, and the lower electrode 170 may be electrically connected to the contact plug 150 and the active region 125. An upper surface of the lower electrode 170 may include a portion in contact with the uppermost support layer 185.

The lower electrode 170 may have an asymmetrical structure. The lower electrode 170 may include a first region overlapping the uppermost support layer 185 in a vertical direction (Z direction) and in contact with the uppermost support layer 185, and a second region not overlapping the uppermost support layer 185 in the vertical direction (Z direction). The second region of the lower electrode 170 may overlap an opening defined by a sidewall 185o of the uppermost support layer 185 in the vertical direction (Z direction). For example, the first region and the second region may be connected to each other in a second direction (X direction).

The first region may have a first height, and the second region may have a second height, lower than the first height. In example embodiments, an upper surface of the first region may have a planar shape substantially parallel to the upper surface of the substrate 110, and an upper surface of the second region may have a shape recessed toward the upper surface of the substrate 110.

The lower electrode 170 may include a first electrode layer 171, a buffer layer 172, and a second electrode layer 173, sequentially stacked. Each of the first electrode layer 171 and the second electrode layer 173 may include a conductive material. In example embodiments, each of the first electrode layer 171 and the second electrode layer 173 may include at least one of a metal and a metal nitride. Each of the first electrode layer 171 and the second electrode layer 173 may include or be formed of, for example, at least one of aluminum (Al), copper (Cu), titanium (Ti), tantalum (Ta), ruthenium (Ru), tungsten (W), and molybdenum. (Mo), platinum (Pt), nickel (Ni), and cobalt (Co), and/or a nitride thereof. Materials included in the first electrode layer 171 and the second electrode layer 173 may be the same as or different from each other.

The buffer layer 172 may be disposed between the first electrode layer 171 and the second electrode layer 173. The buffer layer 172 may include a material different from that of the first electrode layer 171 and the second electrode layer 173. The buffer layer 172 may be formed of a material having compressive stress. The buffer layer 172 may include or be formed of at least one of a metal, a metal nitride, and a metal oxide having compressive stress. In example embodiments, the buffer layer 172 may include or be formed of a metal oxide. The buffer layer 172 may include or be formed of, for example, titanium oxide (TiO), tantalum oxide (TaO), tungsten oxide (WO), or the like, but is not limited thereto.

When the lower electrode has an asymmetrical structure, the lower electrode may have asymmetrical stress. For example, when the lower electrode 170 is formed of a conductive material having tensile stress, the tensile stress of the first region having a relatively high height may be greater than the tensile strength of the second region having a relatively low height. Due to such asymmetrical tensile stress, the lower electrode may be bent in one direction.

In the lower electrode 170 according to example embodiments of the present inventive concept, a buffer layer 172 may be interposed between the first electrode layer 171 and the second electrode layer 173, so that asymmetrical stress of the lower electrode 170 having an asymmetrical structure may be resolved. For example, when the first and second electrode layers 171 and 173 have tensile stress, a buffer layer 172 having compressive stress may be disposed between the first and second electrode layers 171 and 173. Since the tensile stress of the first and second electrode layers 171 and 173 may be offset by the compressive stress of the buffer layer 172, the asymmetrical stress of the lower electrode 170 may be resolved.

In example embodiments, the first electrode layer 171 may have a cylindrical shape having a lower surface and a side surface. The buffer layer 172 may be disposed on the first electrode layer 171 to be in contact with the first electrode layer 171, and may have a cylindrical shape having a lower surface and a side surface. The second electrode layer 173 may be disposed on the buffer layer 172 to be in contact the buffer layer 172, and may fill a space formed by the buffer layer 172. The electrode layer 173 may have, for example, a pillar shape. In example embodiments, the first electrode layer 171 and the second electrode layer 173 may be spaced apart from each other by the buffer layer 172.

Since the lower electrode 170 has a structure in which the buffer layer 172 is disposed between the first and second electrode layers 171 and 173, sufficient electrical conductivity may be secured by including a plurality of electrode layers. In addition, the buffer layer 172 inserted between the plurality of electrode layers may offset the asymmetrical stress of the lower electrode 170 to resolve a bending problem. In addition, since materials forming the first electrode layer 171, the buffer layer 172, and the second electrode layer 173 can be controlled differently, a stress control range of the lower electrode 170 is wide and mass productivity can be improved. For example, when the buffer layer 172 is formed of a material having compressive stress stronger than the tensile stress of the first electrode layer 171, the second electrode layer 173 may be formed of a material having a tensile stress sufficient to offset the compressive stress of the buffer layer 172. A combination of materials of the first electrode layer 171, the buffer layer 172, and the second electrode layer 173 may be variously changed in consideration of internal stress, or the like, of the lower electrode 170.

The first electrode layer 171, the buffer layer 172, and the second electrode layer 173 may include a portion in contact with the uppermost support layer 185, respectively. In example embodiments, the first electrode layer 171, the buffer layer 172, and the second electrode layer 173 in contact with the uppermost support layer 185 may be substantially coplanar. For example, the uppermost surface of each of the first electrode layer 171, the buffer layer 172, and the second electrode layer 173 may be disposed at the same level as a bottom surface of the uppermost support layer 185.

The support layer 185 may be in contact with the lower electrode 170, and may extend in a direction parallel to the substrate 110. The support layer 185 may include a plurality of support layers. Each of the support layers 185 may be disposed to be spaced apart from each other in a Z direction perpendicular to the upper surface of the substrate 110. An uppermost support layer of the support layers 185 may be in contact with the upper surface of the lower electrode 170, and may include a portion overlapping the lower electrode 170 in the Z direction. The remaining support layer may be in contact with a side surface of the lower electrode 170.

The support layer 185 may be a structure supporting a plurality of lower electrodes 170 having a high aspect ratio. Herein, for convenience of description, the terms of the plurality of lower electrodes and the lower electrode may be used interchangeably. Although not shown, the support layer 185 may connect the adjacent lower electrodes 170 to each other. For example, a portion of the semiconductor device 100 of FIG. 2 may be repeatedly arranged at the same interval. Accordingly, the support layer 185 may connect the adjacent lower electrodes 170 to each other. The support layer 185 may include, for example, at least one of silicon oxide, silicon nitride, and silicon oxynitride.

The dielectric layer 180 may be disposed on the etch stop layer 160 to cover the lower electrode 170 and the support layer 185. The dielectric layer 180 may cover an upper surface and a side surface of the lower electrode 170, an upper surface of the etch stop layer 160, and exposed surfaces of the support layer 185.

The dielectric layer 180 may include a high dielectric material, silicon oxide, silicon nitride, or a combination thereof. However, in some example embodiments, the dielectric layer 180 may include an oxide, nitride, silicide, oxynitride, or silicified oxynitride including one of hafnium (Hf), aluminum (Al), zirconium (Zr), and lanthanum (La).

In example embodiments, the dielectric layer 180 may have compressive stress. When the dielectric layer 180 having the compressive stress is disposed on the lower electrode having asymmetrical stress, a bending phenomenon of the lower electrode 170 may be intensified due to the compressive stress of the dielectric layer 180. The lower electrode 170 according to example embodiments of the present inventive concept has a buffer layer interposed between the first and second electrode layers 171 and 173 to relieve the asymmetrical stress of the lower electrode 170, so that even if the dielectric layer 180 having compressive stress is disposed on the lower electrode 170 having an asymmetrical structure, the bending phenomenon of the lower electrode 170 may be alleviated.

The upper electrode 190 may have a structure covering the plurality of lower electrodes 170, the dielectric layer 180, and the support layer 185. The upper electrode 190 may have a structure filling a space between the plurality of lower electrodes 170 and the space between the support layer 185. The upper electrode 190 may be in contact with the dielectric layer 180.

FIG. 2 illustrates an example embodiment in which the upper electrode 190 is configured as a single electrode layer, but is not limited thereto. In other example embodiments, the upper electrode 190 may include a plurality of electrode layers. The upper electrode 190 may include a conductive material. The upper electrode 190 may include, for example, at least one of polycrystalline silicon (Si), titanium (Ti), titanium nitride (TiN), tantalum (Ta), tantalum nitride (TaN), tungsten (W), and tungsten nitride (WN).

FIGS. 3 to 6 are schematic cross-sectional views of semiconductor devices according to example embodiments.

FIGS. 3 to 6 are different from the previous example embodiments of FIGS. 1 and 2 in terms of structures of capacitors CPa, CPb, CPc, and CPd. In the example embodiments of FIGS. 3 to 6, the same reference numerals as those of FIGS. 1 and 2 but different letters are used to describe an example embodiment different from FIGS. 1 and 2. Features described with the same reference numerals as described above may be the same or similar.

Figure 3:
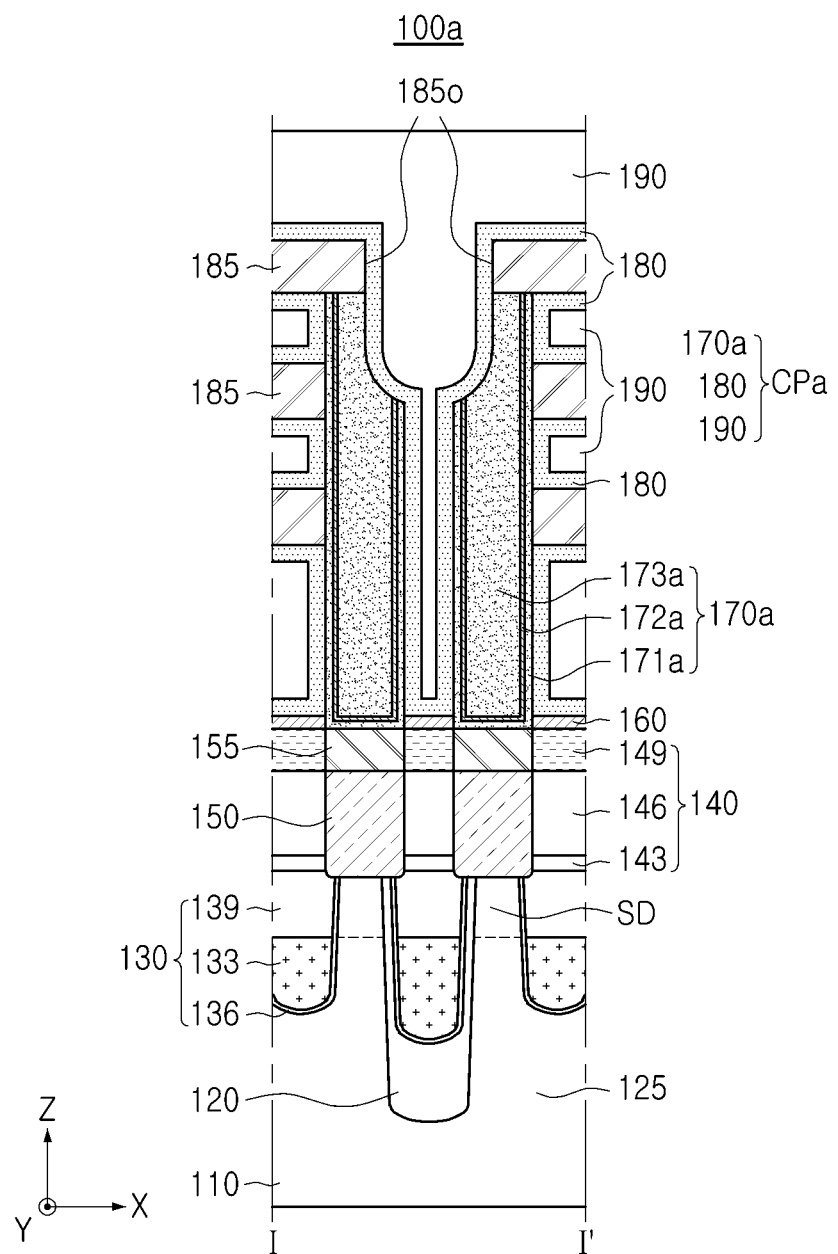
FIG. 3 is a schematic cross-sectional view of a semiconductor device according to example embodiments.

FIG. 3 is a schematic cross-sectional view of a semiconductor device according to example embodiments.

Referring to FIG. 3, a semiconductor device 100a may include a substrate 110, a lower electrode 170a disposed on the substrate 110, a dielectric layer 180 disposed on the lower electrode 170a, and an upper electrode 190 disposed on the dielectric layer 180. The lower electrode 170a may include a first electrode layer 171a, a buffer layer 172a, and a second electrode layer 173a. The semiconductor device 100a is different from the embodiment of FIGS. 1 and 2 in the shape of the buffer layer 172a and the like.

As illustrated in FIG. 3, the buffer layer 172a may be disposed at a position close to an outer side surface of the lower electrode 170a between a central axis and the outer side surface of the lower electrode 170a. Accordingly, compared to the example embodiment of FIG. 2, a thickness of a cylinder of the first electrode layer 171a may be reduced, a diameter of the cylinder of the buffer layer 172a may be increased, a diameter of the cylinder of the second electrode layer 173a may be increased, and a diameter of a pillar of the second electrode layer 173a may be increased. A shape and insertion position of the buffer layer 172a may be changed in consideration of the tensile stress of the first and second electrode layers 171a and 173a, and the like.

Figure 4:
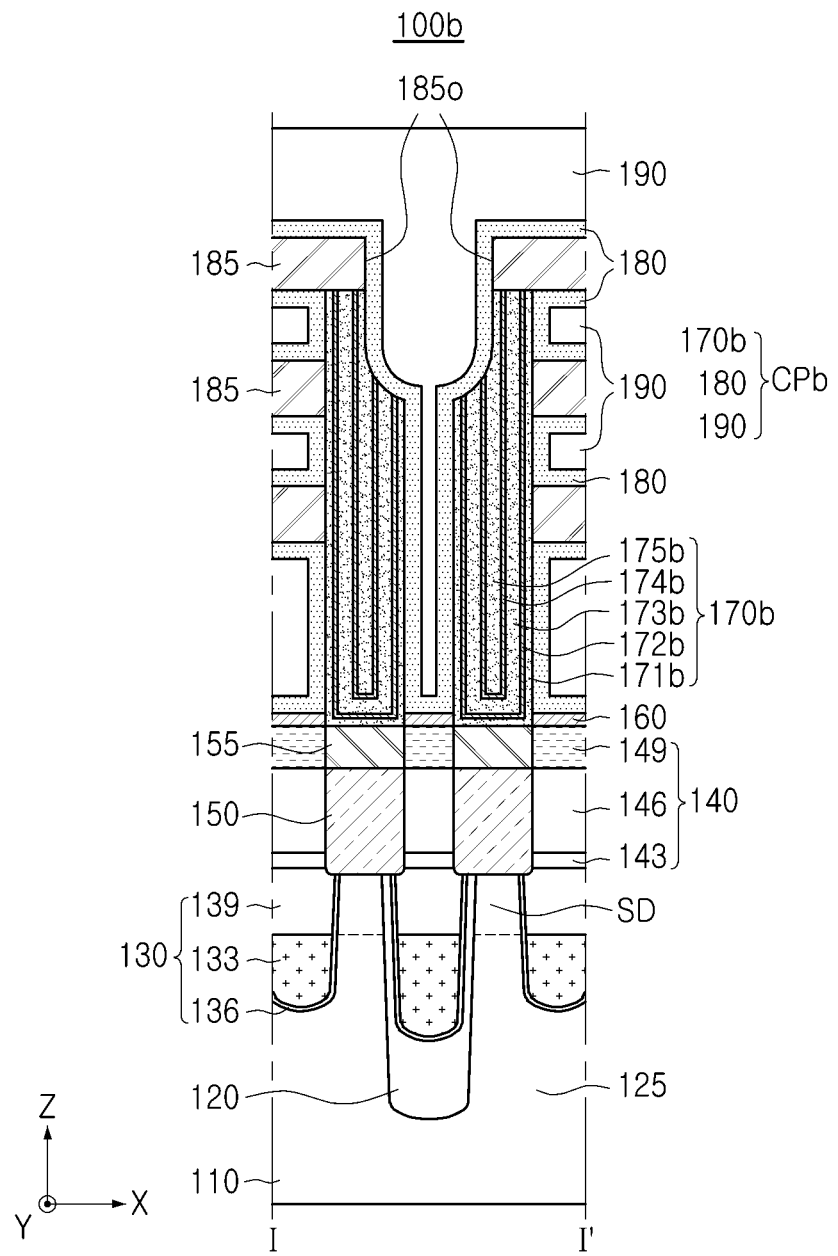
FIG. 4 is a schematic cross-sectional view of a semiconductor device according to example embodiments.

FIG. 4 is a schematic cross-sectional view of a semiconductor device according to example embodiments.

Referring to FIG. 4, a semiconductor device 100b may include a substrate 110, a lower electrode 170b disposed on the substrate 110, a dielectric layer 180 disposed on the lower electrode 170b, and an upper electrode 190 disposed on the dielectric layer 180. The lower electrode 170b may include first to third electrode layers 171b, 173b, and 175b, and first and second buffer layers 172b and 174b. The semiconductor device 100b is different from the example embodiments of FIGS. 1 and 2 in that the lower electrode 170b further includes the second buffer layer 174b.

As illustrated in FIG. 4, the lower electrode 170b may have a structure in which the first electrode layer 171b, the first buffer layer 172b, the second electrode layer 173b, the second buffer layer 174b, and the third electrode layer 175b are sequentially stacked. In example embodiments, the first electrode layer 171b may have a cylindrical shape. The first buffer layer 172b is disposed on the first electrode layer 171b to be in contact with the first electrode layer 171b, and may have a cylindrical shape. The second electrode layer 173b may be disposed on the first buffer layer 172b to be in contact with the first buffer layer 172b, and may have a cylindrical shape. The second buffer layer 174b may be disposed on the second electrode layer 173b to be in contact with the second electrode layer 173b, and may have a cylindrical shape. The third electrode layer 175b may be disposed on the second buffer layer 174b to be in contact with the second buffer layer 174b, and may have a pillar shape filling an inside of a cylinder of the second buffer layer 174b.

The lower electrode 170b may include a plurality of buffer layers 172b and 174b disposed between the electrode layers 171b, 173b, and 175b, so that asymmetrical stress can be more effectively resolved. Since the lower electrode 170b includes a plurality of buffer layers, a stress control range of the lower electrode 170b may be widened. Since the plurality of electrode layers 171b, 173b, and 175b may be formed of different materials, a range of possible materials may be widened and mass productivity may be improved.

The number and dispositional order of the electrode layers and the buffer layers constituting the lower electrode 170b are not limited thereto. For example, the lower electrode 170b may include four or more electrode layers and three or more buffer layers interposed between the electrode layers. In other example embodiments, the dispositional order of the buffer layers and the electrode layers may be changed, or the number of electrode layers and the buffer layers constituting the lower electrode 170b may be the same.

Figure 5:
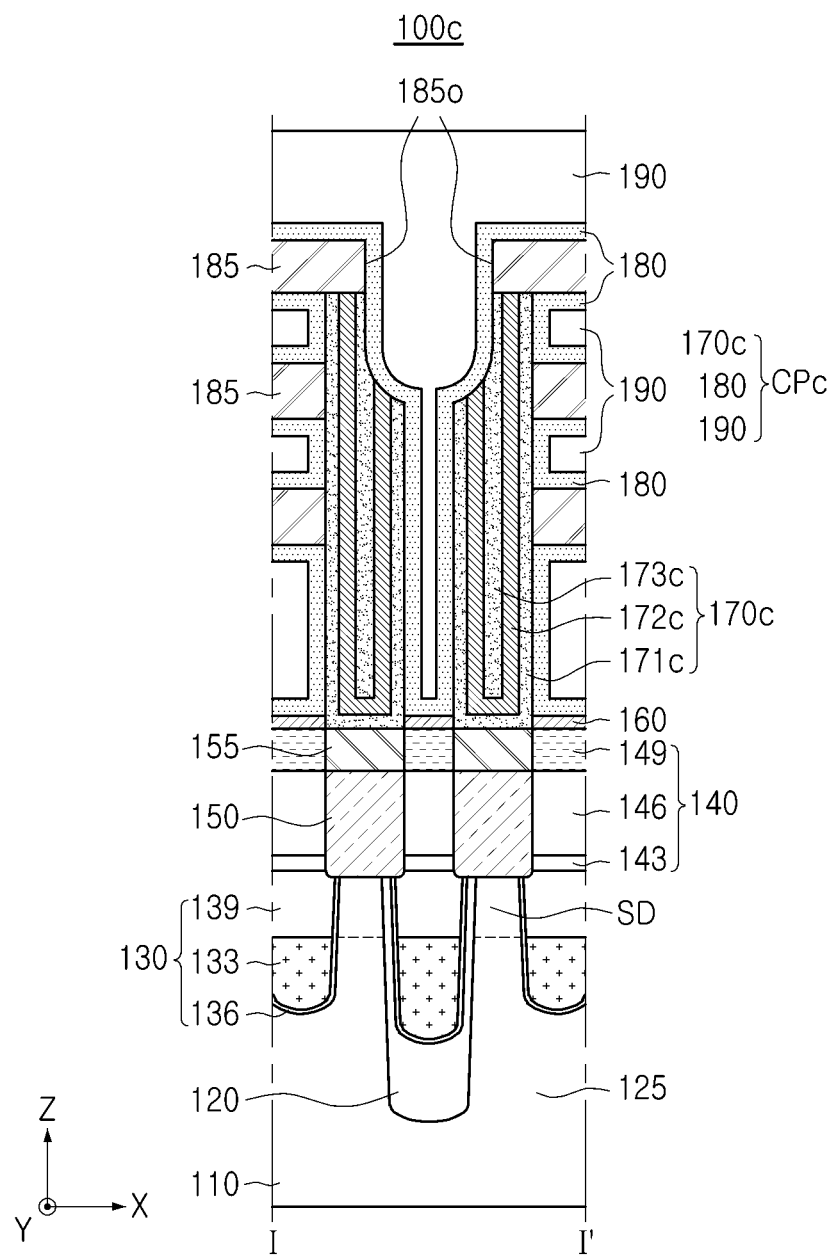
FIG. 5 is a schematic cross-sectional view of a semiconductor device according to example embodiments.

FIG. 5 is a schematic cross-sectional view of a semiconductor device according to example embodiments.

Referring to FIG. 5, a semiconductor device 100c may include a substrate 110, a lower electrode 170c disposed on the substrate 110, a dielectric layer 180 disposed on the lower electrode 170c, and an upper electrode 190 disposed on the dielectric layer 180. The lower electrode 170c may include a first electrode layer 171c, a buffer layer 172c, and a second electrode layer 173c. The semiconductor device 100c is different from the embodiments of FIGS. 1 and 2 in a thickness of the buffer layer 172c of the lower electrode 170c.

As illustrated in FIG. 5C, by increasing a thickness of the buffer layer 172c interposed between the first and second electrode layers 171c and 173c, asymmetrical stress of the lower electrode 170c may be more effectively resolved. Compared with the example embodiment in which a plurality of buffer layers are configured, it is possible to reduce the number of process steps to improve manufacturing efficiency, and to secure sufficient compressive stress to solve the asymmetrical stress. In addition, since sufficient compressive stress can be secured by controlling the thickness of the buffer layer 172c, a range of materials that can be used as the first and second electrode layers 171c and 173c can be widened and productivity can be improved.

Figure 6:
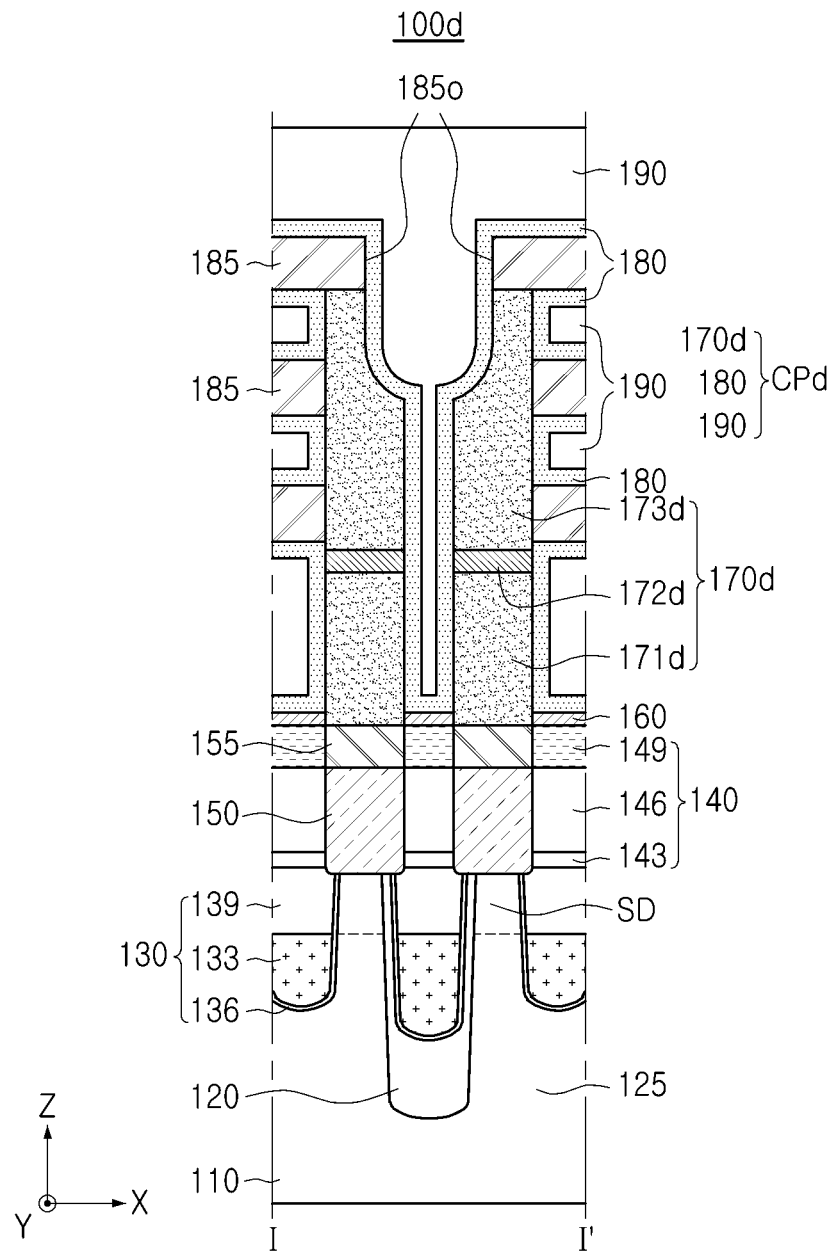
FIG. 6 is a schematic cross-sectional view of a semiconductor device according to example embodiments.

FIG. 6 is a schematic cross-sectional view of a semiconductor device according to example embodiments.

Referring to FIG. 6, a semiconductor device 100d may include a substrate 110, a lower electrode 170d disposed on the substrate 110, a dielectric layer 180 disposed on the lower electrode 170d, and an upper electrode 190 disposed on the dielectric layer 180. The lower electrode 170d may include a first electrode layer 171d, a buffer layer 172d, and a second electrode layer 173d. The semiconductor device 100d is different from the embodiments of FIGS. 1 and 2 in a structure of the lower electrode 170d.

As illustrated in FIG. 6, a first electrode layer 171d may have a pillar shape. The buffer layer 172d may be disposed on the first electrode layer 171d, and may have a layer or column shape. The second electrode layer 173d may be disposed on the buffer layer 172d, and may have an asymmetrical structure. In example embodiments, the second electrode layer 173d may have a cylindrical shape recessed toward the upper surface of the substrate 110 in a region not overlapping the uppermost support layer 185 in a vertical direction (Z direction). However, the recessed shape of the lower electrode 170d is not limited thereto. In other example embodiments, the recess region may extend to the buffer layer 172d or the first electrode layer 171d.

The buffer layer 172d of the lower electrode 170d may be disposed between the electrode layers of a pillar shape, unlike the previous example embodiments, which are disposed between the electrode layers of a cylindrical shape and the electrode layers of a pillar shape. The thickness and position of the buffer layer 172d may vary depending on an aspect ratio of the lower electrode 170d, the type of materials constituting the first and second electrode layers 171d and 173d, and the like.

In an example embodiment illustrated in FIG. 6, the lower electrode 170d may include two electrode layers 171d and 173d and one buffer layer 172d disposed between the electrode layers 171d and 173d, but a structure of the lower electrode 170d is not limited thereto. In other example embodiments, the lower electrode 170d may include three or more electrode layers and two or more buffer layers interposed therebetween. Alternatively, the lower electrode 170d may include the same number of electrode layers and buffer layers.

FIGS. 7A to 7G are schematic cross-sectional views for illustrating a process of manufacturing a semiconductor device according to example embodiments. The cross-sectional views of FIGS. 7A to 7G illustrate cross-sections corresponding to FIG. 2.

Figure 7A:
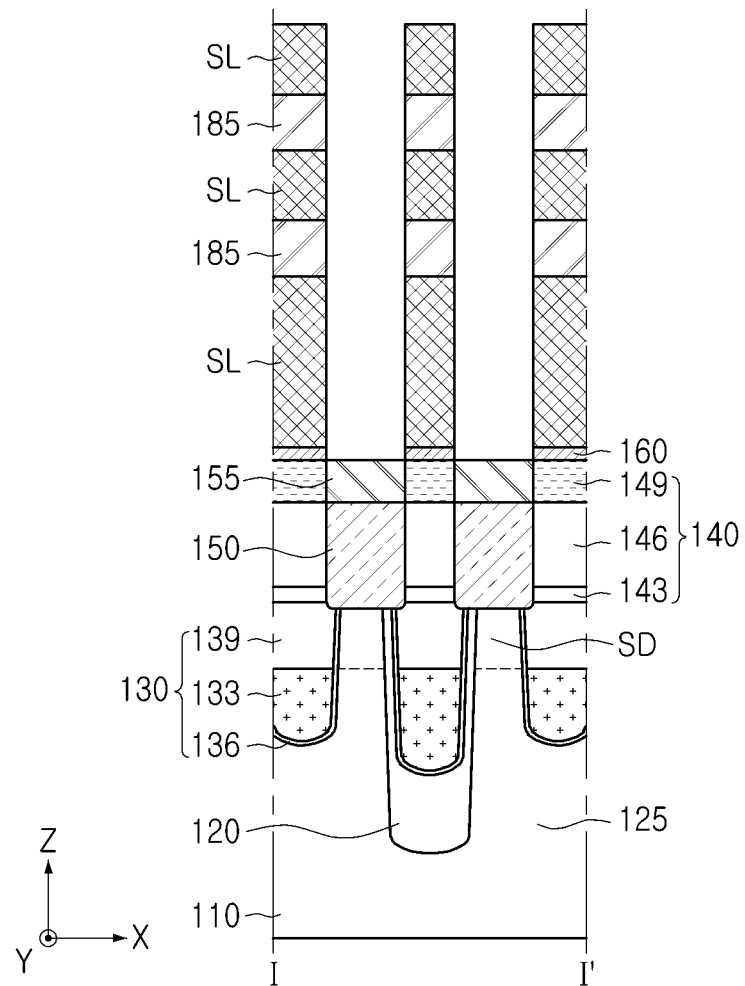
FIGS. 7A to 7G are schematic cross-sectional views for illustrating a method of manufacturing a semiconductor device according to example embodiments.

Referring to FIG. 7A, a lower structure including the substrate 110 may be formed, and mold layers SL and support layers 185 may be alternately stacked on the lower structure. Holes penetrating through the mold layers SL and the support layers 185 may be formed.

Active regions 125 and a device isolation region 120 defining the active regions 125 may be formed on the substrate 110. A portion of the substrate 110 may be removed to form trenches extending in a first direction (Y direction), and buried gate structures 130 may be formed in the trenches. Impurity regions SD may be formed on both sides of the buried gate structures 130, and bit line structures (not shown) may be formed in a second direction (X direction) crossing the first direction (Y direction).

First and second interlayer insulating layers 143 and 146 covering the substrate 110 may be formed. An opening for exposing a portion of the active region 125 through the first and second interlayer insulating layers 143 and 146 may be formed. Contact plugs 150 may be formed by filling the opening with a conductive material. In an example embodiment, the contact plugs 150 may include at least one of polycrystalline silicon (Si), aluminum (Al), copper (Cu), titanium (Ti), tantalum (Ta), ruthenium (Ru), tungsten (W), molybdenum (Mo), platinum (Pt), nickel (Ni), and cobalt (Co), or a nitride thereof.

A third interlayer insulating layer 149 covering the second interlayer insulating layer 146 and the contact plugs 150 may be formed. An opening may be formed through the third interlayer insulating layer 149 to expose at least a portion of the contact plugs 150. The openings may be filled with a conductive material to form landing pads 155. In an example embodiment, the landing pads 155 may include doped polycrystalline silicon (Si).

An etch stop layer 160 covering the third interlayer insulating layer 149 and the landing pads 155 may be formed. The etch stop layer 160 may include an insulating material having etch selectivity with the mold layers SL under a specific etch condition. In an example embodiment, when the mold layers SL include silicon oxide, the etch stop layer 160 may include at least one of silicon nitride (SiN) and silicon carbonitride (SiCN).

A multilayer structure may be formed by alternately stacking mold layers SL and support layers 185 on the etch stop layer 160. In an example embodiment, the mold layers SL include three layers, but the support layers 185 include two layers, but the number of layers is not limited thereto. The mold layer SL and the support layers 185 may have the same thickness or different thicknesses. In an example embodiment, the lowermost mold layer SL may have a greater thickness than the uppermost mold layer SL.

Thereafter, a plurality of holes penetrating through the multilayer structure may be formed. The plurality of holes may penetrate the etch stop layer 160 to expose the landing pad 155.

Figure 7B:
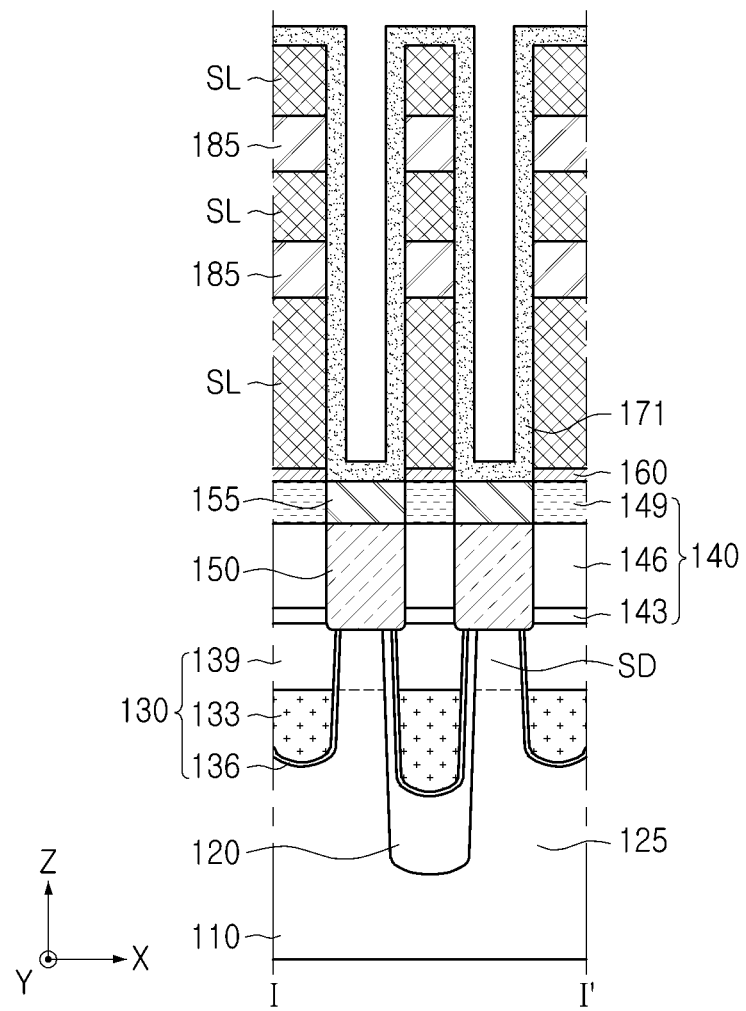

Referring to FIG. 7B, a first electrode layer 171 may be conformally formed inside a plurality of holes and on upper surfaces of the multilayer structures.

The first electrode layer 171, may be formed by, for example, chemical vapor deposition (CVD), atomic layer deposition (ALD), or the like. The first electrode layer 171 may include a conductive material. In example embodiments, the first electrode layer 171 may include metal, a metal nitride, and the like. The first electrode layer 171 may include, for example, at least one of aluminum (Al), copper (Cu), titanium (Ti), tantalum (Ta), ruthenium (Ru), tungsten (W), molybdenum (Mo), platinum (Pt), nickel (Ni), and cobalt (Co), and/or nitrides thereof.

Figure 7C:
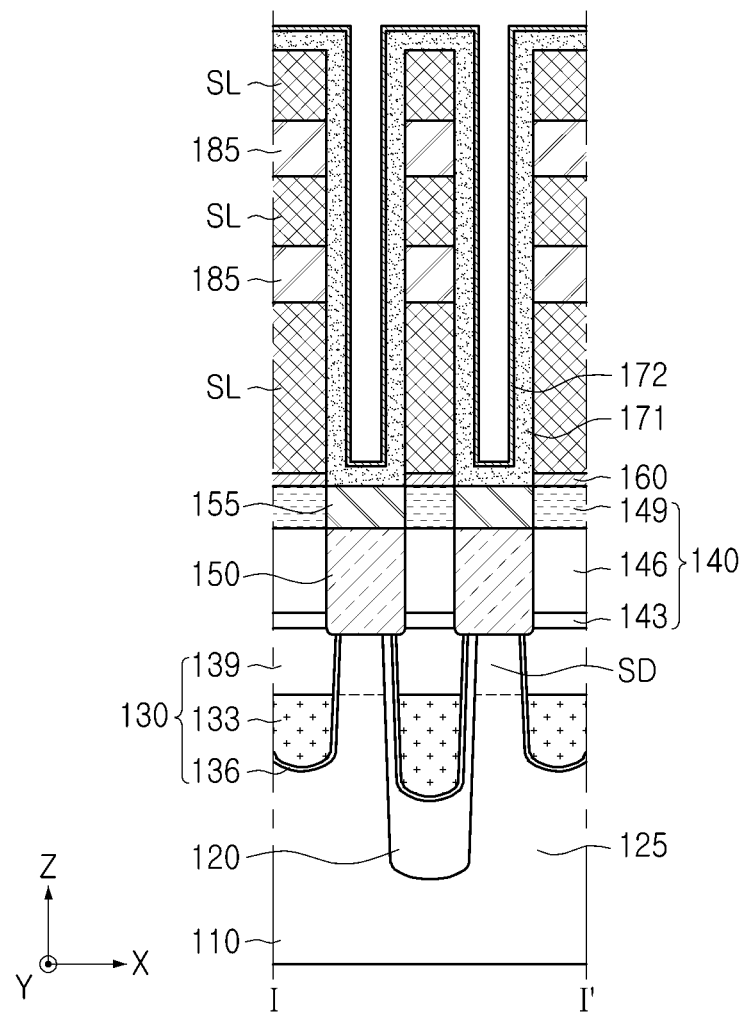

Referring to FIG. 7C, a buffer layer 172 may be formed on the first electrode layer 171.

The buffer layer 172 may be formed on the first electrode layer 171 to offset stress caused by the first electrode layer 171. The buffer layer 172 may offset stress caused by a second electrode layer 173 formed in a process of FIG. 7D to be described later. In example embodiments, when the first electrode layer 171 is formed of a material having a tensile stress, the buffer layer 172 may be formed of a material having compressive stress. In example embodiments, the buffer layer 172 may include metal, a metal nitride, a metal oxide, or the like. The buffer layer 172 may be formed of, for example, a metal oxide.

The buffer layer 172 may be formed by a process such as chemical vapor deposition (CVD), atomic layer deposition (ALD), or the like. When the buffer layer 172 includes a metal oxide, the buffer layer 172 may be formed by oxidation by oxygen ($O_2$), ozone ($O_3$), or plasma thereof.

Figure 7D:
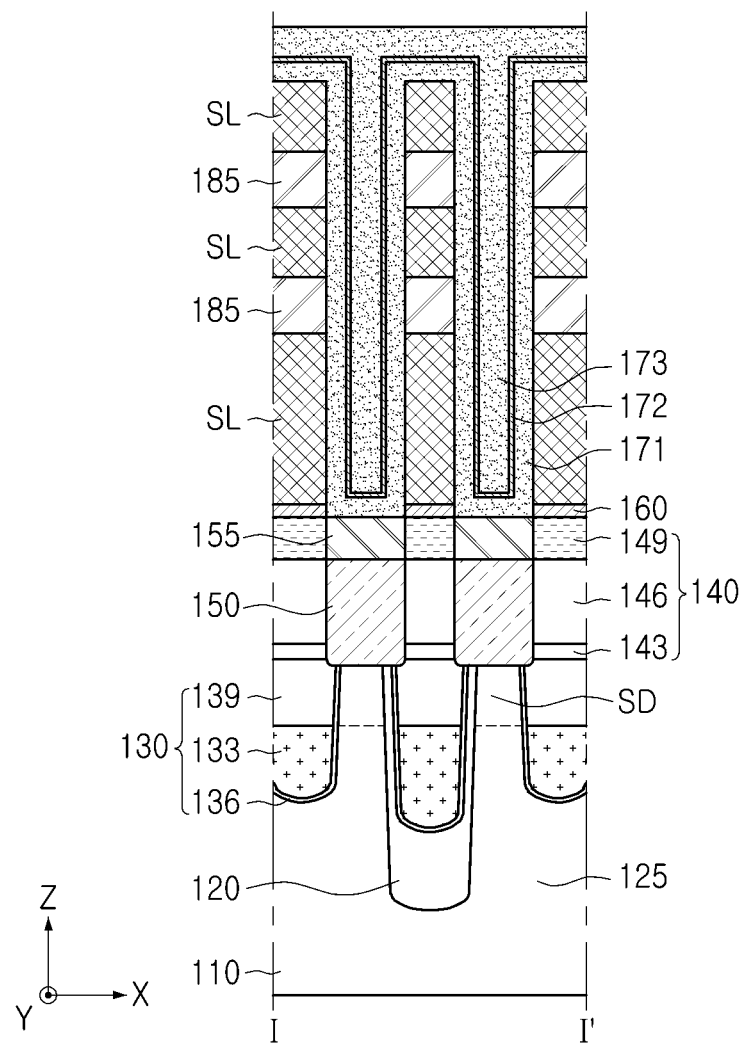

Referring to FIG. 7D, a second electrode layer 173 may be formed on the buffer layer 172.

The second electrode layer 173 may be formed to fill an empty space provided by the buffer layer 172 in a plurality of holes and to cover an upper surface of the buffer layer 172. The second electrode layer 173 may be formed by, for example, chemical vapor deposition (CVD), atomic layer deposition (ALD), or the like.

The second conductive layer 173 may include a conductive material. In example embodiments, the second electrode layer 173 may include metal, a metal nitride, or the like. The second electrode layer 173 may include, for example, at least one of aluminum (Al), copper (Cu), titanium (Ti), tantalum (Ta), ruthenium (Ru), tungsten (W), molybdenum (Mo), platinum (Pt), nickel (Ni) and cobalt (Co), and/or nitrides thereof. The second electrode layer 173 may be formed of the same material as the first electrode layer 171, or may be formed of a material different from that of the first electrode layer 171.

Figure 7E:
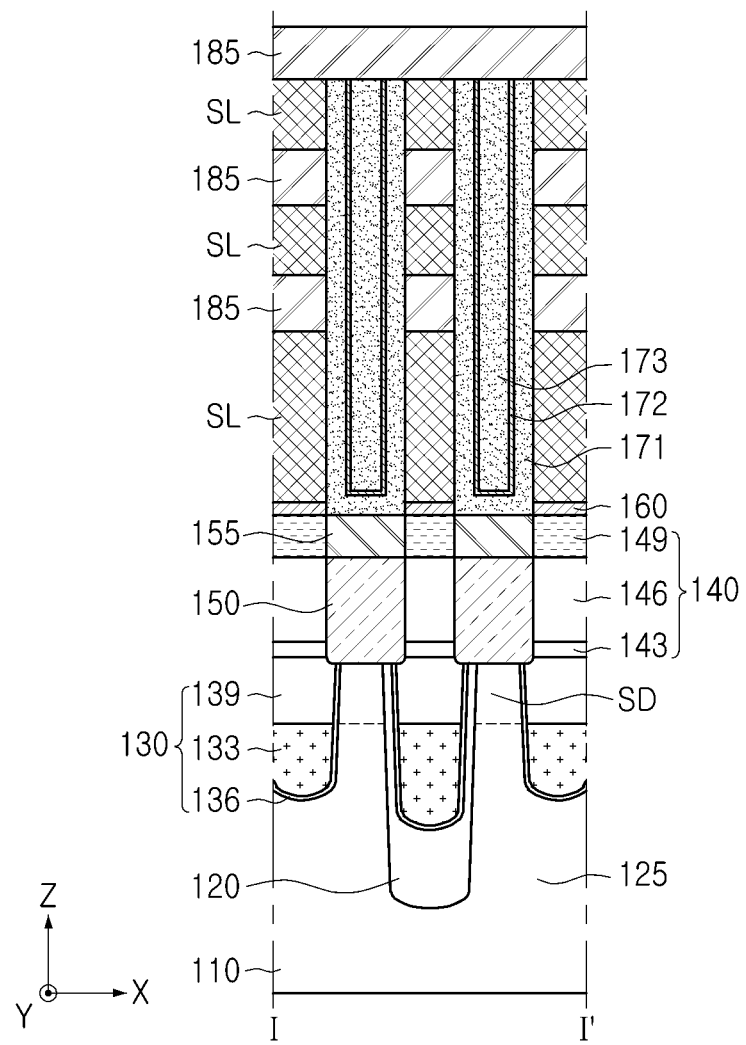

Referring to FIG. 7E, after removing the first electrode layer 171, the buffer layer 172, and the second electrode layer 173 until an upper surface of the multilayer structure is exposed, an uppermost support layer 185 covering an upper surface of the multilayer structure may be formed.

A planarization process may be performed on the first electrode layer 171, the buffer layer 172, and the second electrode layer 173 to expose an upper surface of the uppermost mold layer SL. As the planarization process, for example, a chemical mechanical polishing (CMP) process may be performed. Upper surfaces of the first electrode layer 171, the buffer layer 172, and the second electrode layer 173 formed in a plurality of holes by the planarization process may be substantially coplanar with an upper surface of the uppermost mold layer SL.

The first electrode layer 171, the buffer layer 172, and the second electrode layer 173 formed in the plurality of holes may be separated from each other. Each of the first electrode layer 171, the buffer layer 172, and the second electrode layer 173 may constitute a lower electrode.

Thereafter, an uppermost support layer 185 covering upper surfaces of the uppermost mold layer SL, the first electrode layer 171, the buffer layer 172, and the second electrode layer 173 may be formed. The support layer 185 may include, for example, at least one of silicon oxide, silicon nitride, and silicon oxynitride.

Figure 7F:
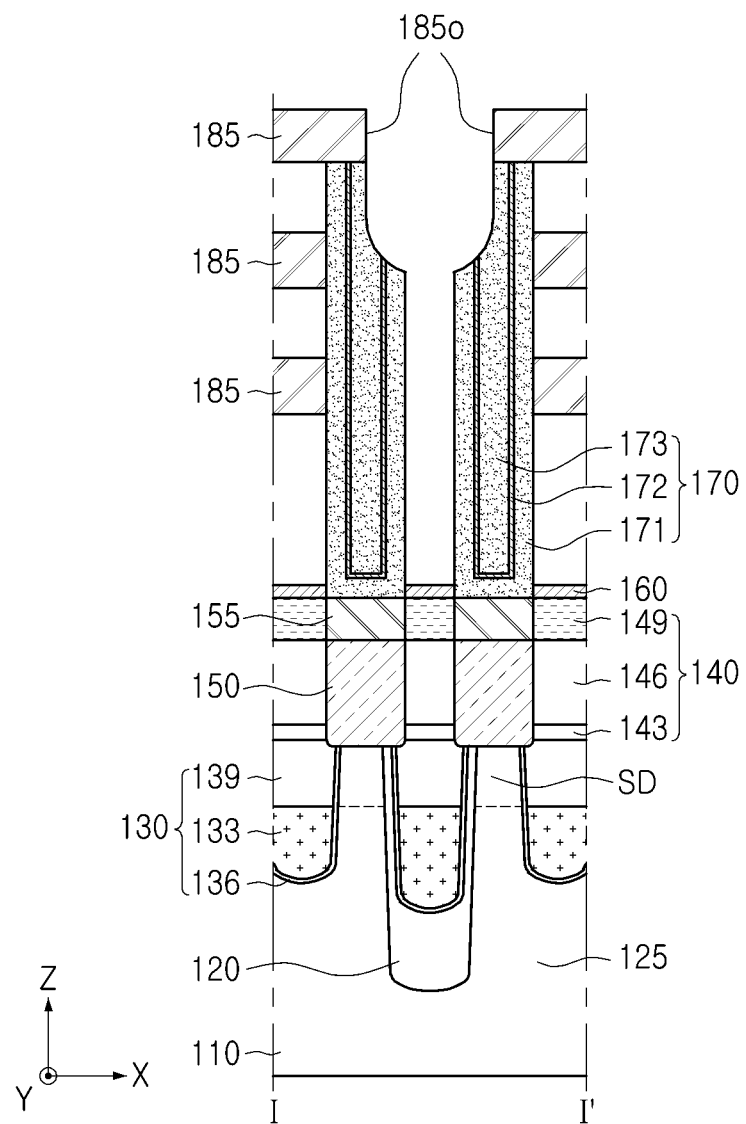

Referring to FIG. 7F, a portion of the uppermost support layer 185 and a portion of the lower electrode 170 may be removed, and a portion of the support layers 185 and the mold layers SL may be removed.

A mask (not shown) covering a portion of the uppermost support layer 185 may be formed, and the uppermost support layer 185 and the lower electrode 170, not overlapping the mask in a vertical direction (Z direction) may be removed by etching.

The uppermost support layer 185 may be partially removed by etching, to include an opening. The opening may be defined by a sidewall 185o of the uppermost support layer 185. For example, the opening may be disposed between the adjacent uppermost support layers 185 in a second direction (X direction).

The lower electrode 170 may have an asymmetrical structure by an etching process. In an example embodiment, the lower electrode 170 may include a first region in contact with the uppermost support layer 185 and overlapping the uppermost support layer 185 in a vertical direction (Z direction), and a second region overlapping an opening of the uppermost support layer 185 in the vertical direction (Z direction). The first region of the lower electrode 170 may have a first height. The second region of the lower electrode 170 may have a second height, lower than the first height. In the first region, the lower electrode 170 may not be etched, and in the second region, the lower electrode 170 may be etched. In the second region, an upper surface of the lower electrode 170 may have a shape recessed toward the upper surface of the substrate 110.

Despite the asymmetrical structure formed by the first and second regions of the lower electrode 170, the asymmetrical stress of the lower electrode 170 may be relieved. For example, when each of the first and second electrode layers 171 and 173 has tensile stress, each of the first and second electrode layers 171 and 173 may have different magnitudes of tensile stress in the first region and the second region. However, according to example embodiments of the present inventive concept, since the lower electrode 170 includes a buffer layer 172 having compressive stress between the first electrode layer 171 and the second electrode layer 173, tensile stress caused by the first and second electrode layers 171 and 173 may be offset.

Figure 7G:
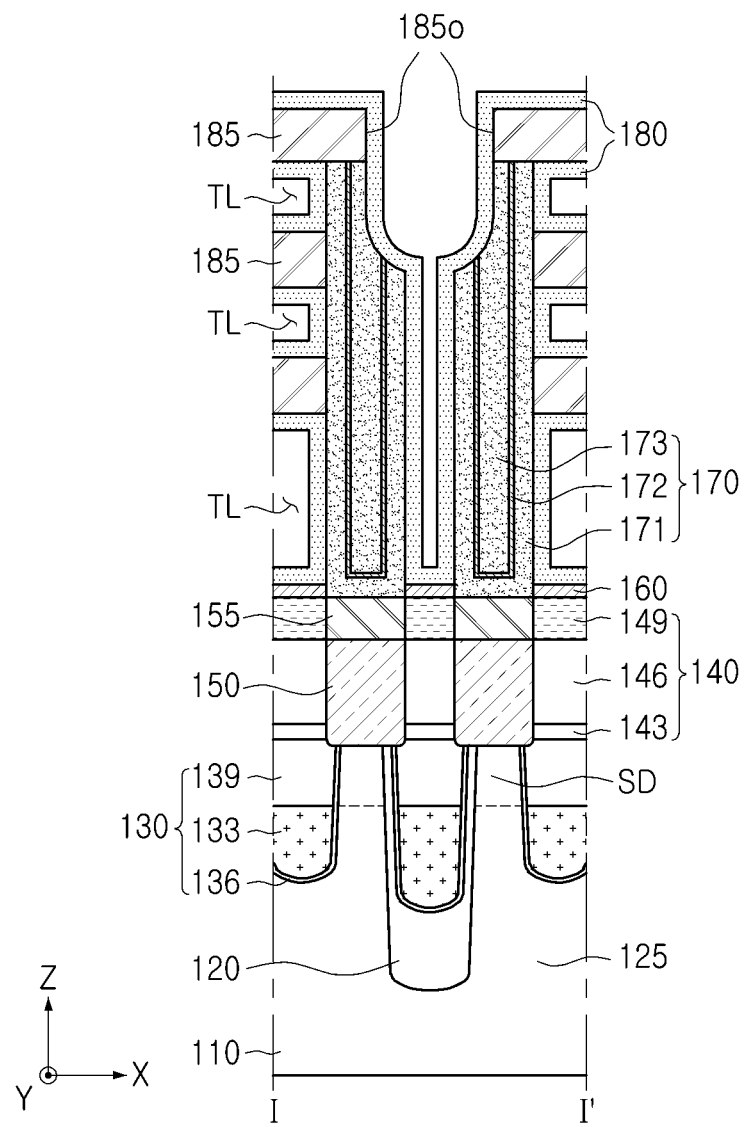

Referring to FIG. 7G, a dielectric layer 180 covering a lower electrode 170 and support layers 185 in contact with the lower electrode 170 may be formed.

The dielectric layer 180 may conformally cover upper surfaces and side surfaces of the lower electrode 170, and an upper surface of the etch stop layer 160, and exposed surfaces of the support layers 185. The dielectric layer 180 may include a high dielectric, silicon oxide, silicon nitride, silicon oxynitride, or a combination thereof.

Referring to back to FIG. 2, an upper electrode 190 may be formed on the dielectric layer 180.

The upper electrode 190 may fill an empty space (TL in FIG. 7G) between the lower electrodes 170 and between the support layers 185, and cover the lower electrode 170 and the support layers 185. The upper electrode 190 may include a conductive material, for example, at least one of polycrystalline silicon (Si), titanium (Ti), titanium nitride (TiN), tantalum (Ta), tantalum nitride (TaN), tungsten (W), and tungsten nitride (WN).

Figure 8:
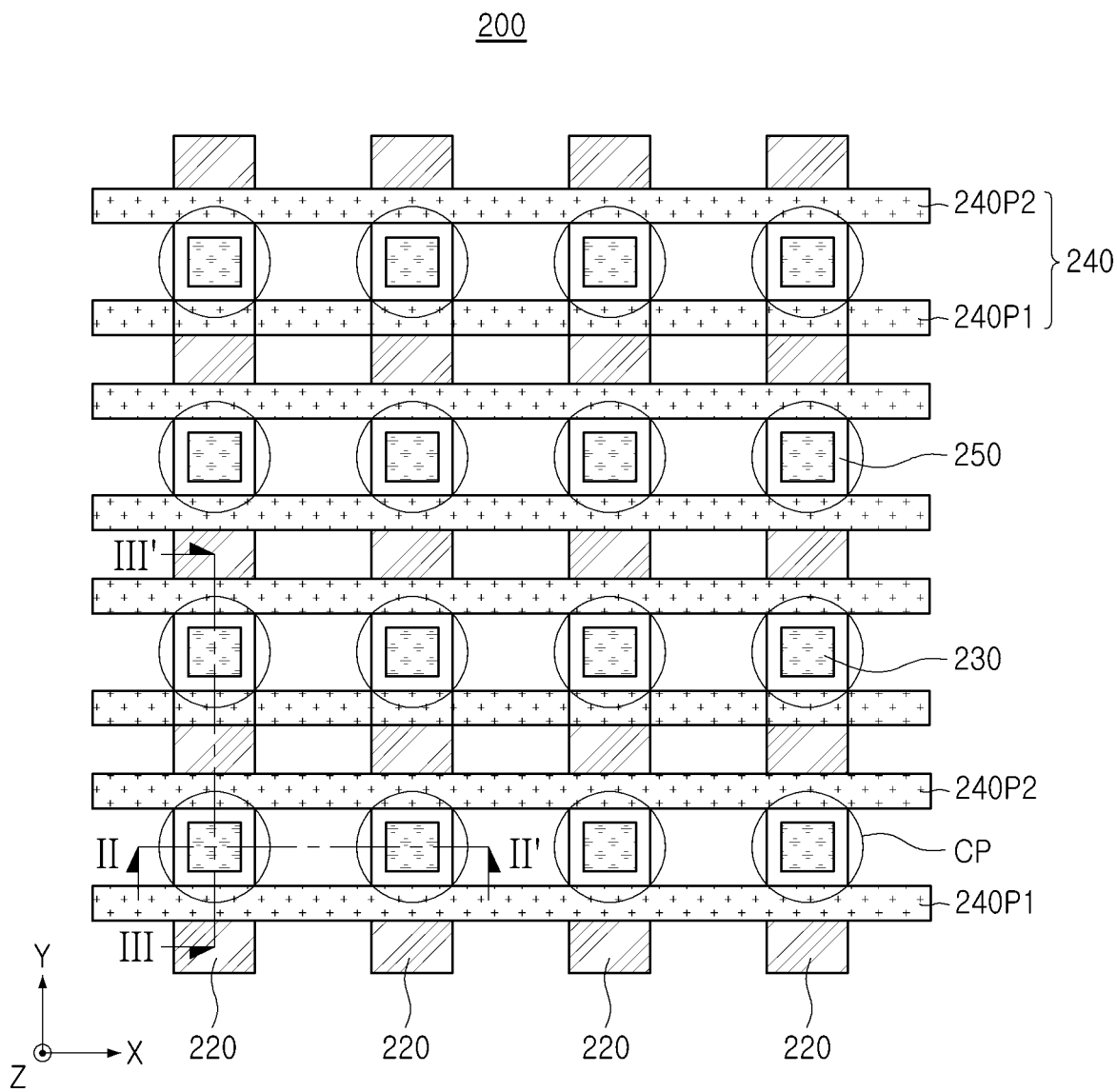
FIG. 8 is a schematic layout diagram of a semiconductor device according to example embodiments.
Figure 9:
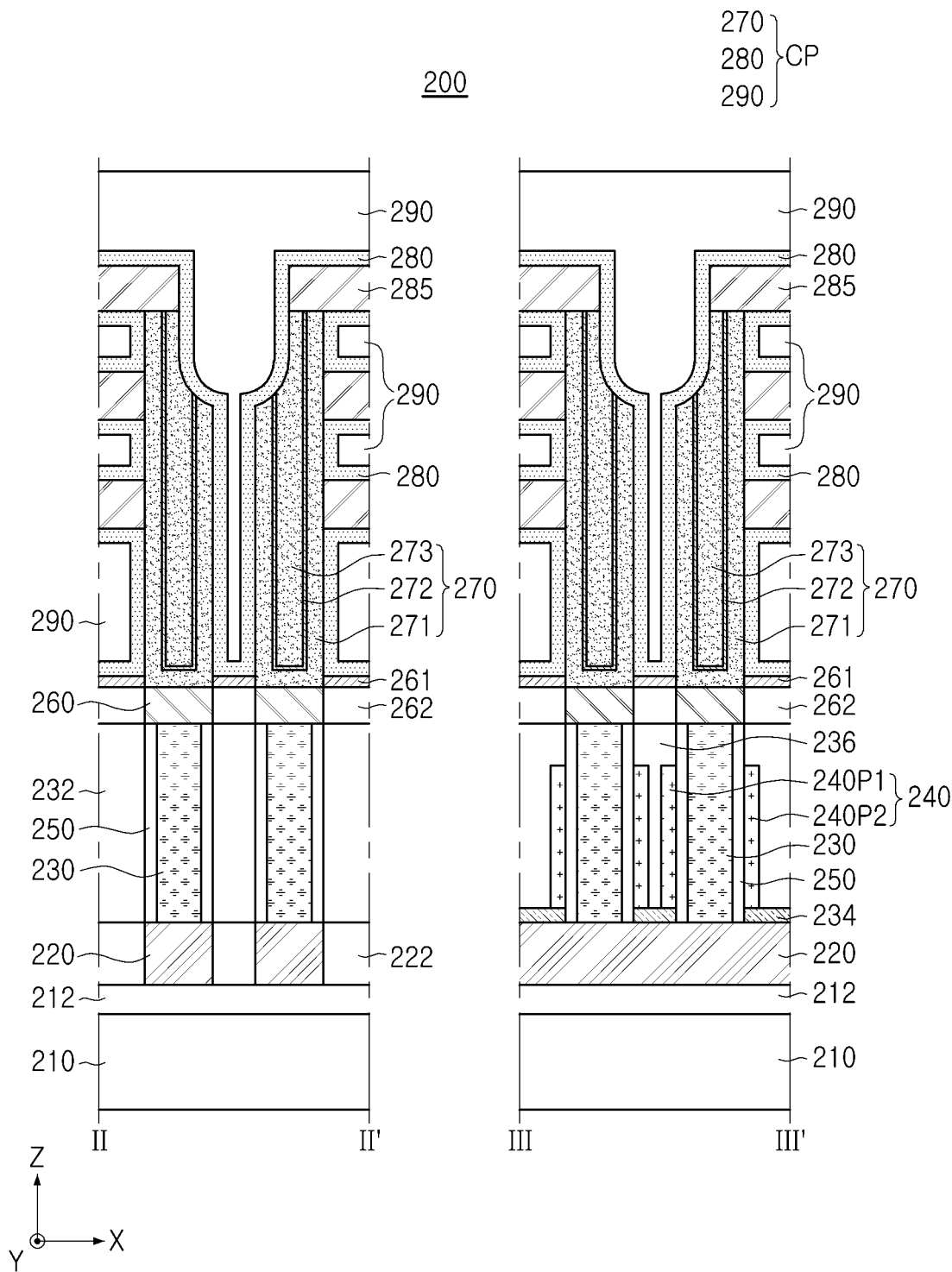
FIG. 9 is a schematic cross-sectional view of a semiconductor device according to example embodiments.

FIGS. 8 and 9 illustrate a semiconductor device according to example embodiments.

FIG. 8 is a layout diagram of a semiconductor device according to example embodiments. FIG. 9 is a cross-sectional view of a semiconductor device according to example embodiments. FIG. 9 illustrates a cross-section taken along II-II' and III-III' of FIG. 8.

Referring to FIGS. 8 and 9, a semiconductor device 200 may include a substrate 210, a plurality of first conductive lines 220, a channel layer 230, a gate electrode layer 240, a gate insulating layer 250, and a capacitor CP. The semiconductor device 200 may be a memory device including a vertical channel transistor (VCT). The vertical channel transistor may refer to a structure in which a channel length of the channel layer 230 extends in a vertical direction from the substrate 210.

A lower insulating layer 212 may be disposed on the substrate 210, and a plurality of first conductive lines 220 may be spaced apart from each other in an X direction and extend in a Y direction on the lower insulating layer 212. A plurality of first insulating patterns 222 may be disposed to fill a space between the plurality of first conductive lines 220 on the lower insulating layer 212. The plurality of first insulating patterns 222 may extend in a Y direction, and upper surfaces of the plurality of first insulating patterns 222 may be disposed at the same level as upper surfaces of the plurality of first conductive lines 220. The plurality of first conductive lines 220 may function as bit lines of the semiconductor device 200.

In example embodiments, the plurality of first conductive lines 220 may include doped polycrystalline silicon, a metal, a conductive metal nitride, a conductive metal silicide, a conductive metal oxide, or a combination thereof. For example, the plurality of first conductive lines 220 may include at least one of doped polycrystalline silicon, aluminum (Al), copper (Cu), titanium (Ti), tantalum (Ta), ruthenium (Ru), tungsten (W), molybdenum, (Mo), platinum (Pt), nickel (Ni), and cobalt (Co), or include a nitride thereof, but is not limited thereto. The plurality of first conductive lines 220 may include a single layer or multiple layers of the aforementioned materials. In example embodiments, the plurality of first conductive lines 220 may include a 2D semiconductor material, for example, the 2D semiconductor material may include graphene, carbon nanotube, or combinations thereof.

The channel layer 230 may be arranged in a matrix form spaced apart from each other in the X and Y directions on the plurality of first conductive lines 220. The channel layer 230 may have a first width in the X direction and a first height in the Z direction, and the first height may be greater than the first width. For example, the first height may be about 2 to 10 times the first width, but is not limited thereto. A bottom portion of the channel layer 230 may function as a first source/drain region (not shown), and an upper portion of the channel layer 230 may function as a second source/drain region (not shown), and a portion of the channel layer 230 between the first and second/drain regions may function as a channel region (not shown).

In example embodiments, the channel layer 230 may include an oxide semiconductor, for example, the oxide semiconductor may include $In_xGa_yZn_zO$, $In_xGa_ySi_zO$, $In_xSn_yZn_zO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_x$-$Ga_yO$, or a combination thereof. The channel layer 230 may include a single layer or multiple layers of an oxide semiconductor. In some example, the channel layer 230 may have a bandgap energy greater than that of silicon. For example, the channel layer 230 may have a bandgap energy of about 1.5 eV to 5.6 eV. For example, the channel layer 230 may have optimal channel performance when the channel layer has a bandgap energy of about 2.0 eV to 4.0 eV. For example, the channel layer 230 may be polycrystalline or amorphous, but is not limited thereto. In example embodiments, the channel layer 230 may include a 2D semiconductor material, and for example, the 2D semiconductor material may include graphene, carbon nanotube, or a combination thereof.

The gate electrode layer 240 may extend in the X direction on both sidewalls of the channel layer 230. The gate electrode layer 240 may include a first sub-gate electrode 240P1 facing a first sidewall of the channel layer 230 and a second sub-gate electrode 240P2 facing a second sidewall opposite to the first sidewall of the channel layer 230. As one channel layer 230 is disposed between the first sub-gate electrode 240P1 and the second sub-gate electrode 240P2, the semiconductor device 200 may have a dual-gate transistor structure. However, the technical spirit of the present inventive concept is not limited thereto, and the second sub-gate electrode 240P2 may be omitted and only the first sub-gate electrode 240P1 facing the first sidewall of the channel layer 230 may be formed to form a single gate. Thus, a transistor structure may be implemented.

The gate electrode layer 240 may include doped polycrystalline silicon, metal, conductive metal nitride, conductive metal silicide, conductive metal oxide, or a combination thereof. For example, the gate electrode layer 240 may include at least one of doped polycrystalline silicon, aluminum (Al), copper (Cu), titanium (Ti), tantalum (Ta), ruthenium (Ru), tungsten (W), molybdenum (Mo), platinum (Pt), nickel (Ni), and cobalt (Co), or may include a nitride thereof, but is not limited thereto.

The gate insulating layer 250 may surround a sidewall of the channel layer 230, and may be interposed between the channel layer 230 and the gate electrode layer 240. For example, as illustrated in FIGS. 8 and 9, an entire sidewall of the channel layer 230 may be surrounded by the gate insulating layer 250, and a portion of the sidewall of the gate electrode layer 240 may be in contact with the gate insulating layer 250. In other example embodiments, the gate insulating layer 250 may extend in an extension direction (i.e., second direction (X direction)) of the gate electrode layer 240, and only two sidewalk facing the gate electrode layer 240 may also be in contact with the gate insulating layer 250.

In example embodiments, the gate insulating layer 250 may be formed of a silicon oxide film, a silicon oxynitride film, a high-k film having a dielectric constant higher than that of the silicon oxide film, or a combination thereof. The high-k film may be formed of a metal oxide or a metal oxynitride. For example, the high-k film that can be used as the gate insulating layer 250 may be made of $HfO_2$, HfSiO, HfSiON, HfTaO, HfTiO, HfZrO, $ZrO_2$, $Al_2O_3$, or a combination thereof, but is not limited thereto.

A plurality of second insulating patterns 232 may extend in the first direction (Y direction) on the plurality of first insulating patterns 222, and a channel layer 230 may be disposed between the adjacent two second insulating patterns 232 among the plurality of second insulating patterns 232. In addition, a first buried layer 234 and a second buried layer 236 may be disposed in a space between two adjacent channel layers 230 between two adjacent second insulating patterns 232. The first buried layer 234 may be disposed in a bottom portion of the space between the two adjacent channel layers 230, and the second buried layer 236 may be formed to fill a remainder of the space between the two adjacent channel layers 230 on the first buried layer 234. An upper surface of the second buried layer 236 may be disposed at the same level as an upper surface of the channel layer 230, and the second buried layer 236 may cover an upper surface of the gate electrode layer 240. Alternatively, the plurality of second insulating patterns 232 may be formed of a continuous material layer with the plurality of first insulating patterns 222, or the second buried layer 236 may be formed of a continuous material layer with the first buried layer 234.

A contact plug 260 may be disposed on the channel layer 230. The contact plug 260 may be disposed to vertically overlap the channel layer 230, and may be arranged in a matrix form spaced apart from each other in the X and Y directions. The contact plug 260 may include at least one of doped polycrystalline silicon, aluminum (Al), copper (Cu), titanium (Ti), tantalum (Ta), ruthenium (Ru), tungsten (W), molybdenum (Mo), platinum (Pt), nickel (Ni), and cobalt (Co), or may include a nitride thereof, but is not limited thereto. The upper insulating layer 262 may surround a sidewall of the contact plug 260 on the plurality of second insulating patterns 232 and the second buried layer 236.

An etch stop layer 261 may be disposed on the upper insulating layer 262, and a capacitor CP may be disposed on the etch stop layer 261. The capacitor CP may include a lower electrode 270, a dielectric layer 280, and an upper electrode 290. In an example embodiment, the capacitor CP may have the same or similar structure as that described with reference to FIGS. 1 to 6.

As set forth above, by solving a bending problem of a capacitor having a lower electrode having an asymmetrical structure, reliability of a semiconductor device may be improved.

While example embodiments have been shown and described above, it will be apparent to those skilled in the art that modifications and variations could be made without departing from the scope of the present inventive concept as defined by the appended claims.

What is claimed is:

1. A semiconductor device, comprising:
a substrate;
a contact plug on the substrate;
a lower electrode electrically connected to the contact plug, and including a first electrode layer, a first buffer layer, and a second electrode layer, sequentially stacked;
a first support layer in contact with an upper surface of the lower electrode and disposed to overlap at least a portion of the lower electrode, the first support layer extending in a direction parallel to an upper surface of the substrate;
a dielectric layer disposed on the lower electrode and the first support layer; and
an upper electrode disposed on the dielectric layer,
wherein the lower electrode comprises:
a first region overlapping the first support layer, and having a first height; and
a second region not overlapping the first support layer, and having a second height lower than the first height.

2. The semiconductor device of claim 1, wherein each of the first electrode layer and the first buffer layer has a cylindrical shape, and
wherein the second electrode layer has a pillar shape filling an inside of the first buffer layer.

3. The semiconductor device of claim 1, wherein each of the first electrode layer, the first buffer layer, and the second electrode layer comprises a portion in contact with the first support layer.

4. The semiconductor device of claim 1, wherein the lower electrode further comprises:
a second buffer layer disposed on the second electrode layer; and
a third electrode layer disposed on the second buffer layer.

5. The semiconductor device of claim 4, wherein each of the first electrode layer, the first buffer layer, the second electrode layer, and the second buffer layer has a cylindrical shape, and
wherein the third electrode layer has a pillar shape filling an inside of the second buffer layer.

6. The semiconductor device of claim 1, wherein the first electrode layer has a pillar shape,
wherein the first buffer layer is disposed on an upper surface of the first electrode layer, and
wherein the second electrode layer is disposed on an upper surface of the first buffer layer.

7. The semiconductor device of claim 1, wherein the first buffer layer has compressive stress.

8. The semiconductor device of claim 1, further comprising:
at least one second support layer in contact with a sidewall of the lower electrode, and extending in a direction parallel to an upper surface of the substrate.

9. The semiconductor device of claim 1, wherein the first buffer layer comprises a metal oxide, and
wherein each of the first electrode layer and the second electrode layer comprises at least one of a metal and a metal nitride.

10. The semiconductor device of claim 1, wherein the first electrode layer and the second electrode layer comprise different materials from each other.

11. A semiconductor device, comprising:
a substrate;
lower electrodes disposed on the substrate;
a support layer in contact with the lower electrodes, and connecting the adjacent lower electrodes, the support layer having an opening;
a dielectric layer disposed on the lower electrodes and the support layer; and
an upper electrode disposed on the dielectric layer,
wherein each of the lower electrodes comprises:
a first electrode layer disposed on the substrate, and including a first material;
a first buffer layer disposed on the first electrode layer, and including a second material; and
a second electrode layer disposed on the first buffer layer, and including a third material,
wherein at least one of the lower electrodes comprises a first region vertically overlapping the support layer and in contact with the support layer, and a second region vertically overlapping the opening,
wherein the opening is disposed between the adjacent support layers, and
wherein the second material is different from each of the first and third materials.

12. The semiconductor device of claim 11, wherein each of the first material and the third material comprises at least one of a metal and a metal nitride.

13. The semiconductor device of claim 11, wherein the second material comprises at least one of a metal, a metal nitride, and a metal oxide.

14. The semiconductor device of claim 13, wherein the second material comprises at least one metal oxide.

15. The semiconductor device of claim 11, wherein the first material and the third material are different from each other.

16. The semiconductor device of claim 11, wherein the lower electrodes further comprise:

a second buffer layer disposed on the second electrode layer, and including a fourth material; and a third electrode layer disposed on the second buffer layer, and including a fifth material.

17. The semiconductor device of claim 16, wherein the fourth material has compressive stress, and is different from the first material, the third material, and the fifth material.

18. A semiconductor device, comprising:

a lower electrode including a first region and a second region;

a dielectric layer disposed on the lower electrode; and an upper electrode disposed on the dielectric layer, wherein the lower electrode comprises:

a plurality of electrode layers; and at least one buffer layer interposed between the plurality of electrode layers, and including at least one metal oxide, and wherein the first region has a first height and the second region has a second height lower than the first height.

19. The semiconductor device of claim 18, wherein the lowermost electrode layer among the plurality of electrode layers has a cylindrical shape or a pillar shape.

20. The semiconductor device of claim 18, further comprising:

a support layer including a portion in contact with an upper surface of the lower electrode in the first region of the lower electrode.

* * * * *